(12) United States Patent
Yamamoto et al.

(10) Patent No.: US 10,015,876 B2
(45) Date of Patent: Jul. 3, 2018

(54) PRINTED BOARD AND METHOD FOR MANUFACTURING SAME

(71) Applicant: TANAZAWA HAKKOSHA CO., LTD., Higashiosaka-shi, Osaka (JP)

(72) Inventors: Keiichiro Yamamoto, Higashiosaka (JP); Kazuhiro Sasamoto, Higashiosaka (JP)

(73) Assignee: TANAZAWA HAKKOSHA CO., LTD., Higashiosaka-Shi, Osaka (JP)

( * ) Notice: Subject to any disclaimer, the term of this patent is extended or adjusted under 35 U.S.C. 154(b) by 0 days.

(21) Appl. No.: 15/501,821

(22) PCT Filed: Jun. 12, 2015

(86) PCT No.: PCT/JP2015/067085
§ 371 (c)(1),
(2) Date: Feb. 3, 2017

(87) PCT Pub. No.: WO2016/157552
PCT Pub. Date: Oct. 6, 2016

(65) Prior Publication Data
US 2017/0238409 A1    Aug. 17, 2017

(30) Foreign Application Priority Data
Mar. 31, 2015   (JP) ................. 2015-071111

(51) Int. Cl.
*H05K 1/02* (2006.01)
*H05K 3/46* (2006.01)
*H05K 3/06* (2006.01)

(52) U.S. Cl.
CPC ............. *H05K 1/0203* (2013.01); *H05K 3/06* (2013.01); *H05K 3/4644* (2013.01); *H05K 2201/068* (2013.01)

(58) Field of Classification Search
CPC ...... H05K 1/0203; H05K 3/4644; H05K 3/06; H05K 2201/068; H05K 3/0058; H05K 2201/0358; H05K 1/0209
(Continued)

(56) References Cited

U.S. PATENT DOCUMENTS

RE29,181 E  *  4/1977  Dixon, III ................. C23F 1/44
                                                              134/3
4,859,805 A  *  8/1989  Kawakami ........... H05K 1/0209
                                                            174/252
(Continued)

FOREIGN PATENT DOCUMENTS

JP        05-267829        *  3/1992
JP    H05-267829 A       10/1993
(Continued)

*Primary Examiner* — Timothy Thompson
*Assistant Examiner* — Michael F McAllister
(74) *Attorney, Agent, or Firm* — Rabin & Berdo, P.C.

(57) ABSTRACT

The object of the present invention is to provide a printed circuit board that improves the heat radiating effect as the entire printed circuit board and a manufacturing method for such a printed circuit board. A printed circuit board includes a base member having two main surfaces, at least one heat-radiating conductor layer formed on at least one of the main surfaces of the two main surfaces of the base member and a solder resist layer formed on a surface of the heat-radiating conductor layer, and in this printed circuit board, the heat-radiating conductor layer has two main surfaces and at least one side face, the heat-radiating conductor layer has its one main surface of the two main surfaces made in planar contact with the main surface of the base member, the solder resist layer further has an etching liquid resistance, and is formed on the other main surface of the two main surfaces of the heat-radiating conductor layer, with the side face of the heat-radiating conductor layer being exposed, and the heat-radiating conductor layer and the solder resist layer are
(Continued)

allowed to form a laminate 24 having a substantially convex shape with an appropriate height.

4 Claims, 9 Drawing Sheets

(58) Field of Classification Search
USPC .......................................................... 174/252
See application file for complete search history.

(56) References Cited

U.S. PATENT DOCUMENTS

| | | | |
|---|---|---|---|
| 8,535,546 B2* | 9/2013 | Maeda | H01L 21/4857 216/13 |
| 8,581,388 B2* | 11/2013 | Maeda | H01L 23/49811 257/700 |
| 2014/0268780 A1* | 9/2014 | Wang | F21V 19/003 362/249.06 |

FOREIGN PATENT DOCUMENTS

| | | |
|---|---|---|
| JP | 2009-135247 A | 6/2009 |
| JP | 2011-222962 A | 11/2011 |
| JP | 2015-065384 A | 4/2015 |

* cited by examiner

US 10,015,876 B2

PRINTED BOARD AND METHOD FOR MANUFACTURING SAME

FIELD OF THE INVENTION

This invention relates to a printed circuit board and a manufacturing method thereof, and more particularly concerns such a printed circuit board as to have a laminate made by a heat-radiating conductor layer and a solder resist layer formed on a heat-radiating surface and a manufacturing method of a printed circuit board for use in manufacturing such a printed circuit board.

BACKGROUND OF THE INVENTION

FIG. 12 is a cross-sectional view showing a printed circuit board relating to a conventional technique.

A printed circuit board 100 relating to the conventional technique includes a base member 112. On a circuit surface of the base member 112, a large number of part assembling conductor layers 114, wiring conductor layers 116 and circuit surface resist layers 118 are formed. On a heat-radiating surface of the base member 112, a solder resist layer 122 is formed so as to cover a large number of heat-radiating conductor layers 120.

Therefore, the printed circuit board 100 relating to the conventional technique has a configuration in which the heat-radiating conductor layers 120 are not exposed, but covered with the solder resist layer 122.

FIG. 13 is a flow chart for explaining manufacturing processes of a printed circuit board relating to the conventional technique. In the flow chart, an A-surface is a circuit surface and a B-surface is a heat-radiating surface.

FIG. 14 to FIG. 21 are process cross-sectional views for explaining manufacturing processes of the printed circuit board relating to the conventional technique.

Referring to FIG. 13 and FIG. 14 to FIG. 21, the following description will discuss the manufacturing processes thereof.

In the first step S101 shown in FIG. 13, as shown in FIG. 14, a base substrate 200 in which metal layers 220 are formed on two surfaces of the base member 112 is prepared as a base member.

In step S102 and step S103, as shown in FIG. 15, after pretreatments such as washing, roughening process and the like, a heat-radiating surface pattern printing process is carried out on the metal layer 220 on the heat-radiating surface side of the base substrate 200 by using an etching resist ink, and the etching resist ink is then cured so that an etching resist layer 320 is formed.

In step S104, as shown in FIG. 16, a circuit surface pattern printing process is carried out on the metal layer 220 on the circuit surface side of the base substrate 200 by using an etching resist ink, and the etching resist ink is then cured so that an etching resist layer 420 is formed.

In step S105, as shown in FIG. 17, an etching process is carried out on the metal layers 220 on the two surfaces of the base substrate 200 so that unnecessary portions are removed.

In step S106, as shown in FIG. 18, ink removing works are carried out so that both of the etching resist layers 320 and 420 on the circuit surface and the heat-radiating surface are removed.

In step S107 and step S108, as shown in FIG. 19, after pretreatments, a first circuit surface resist printing process is carried out on the circuit surface side by using a solder resist ink, and thereafter, by curing the solder resist ink, a first solder resist layer 118a is formed.

In step S109, as shown in FIG. 20, on the first solder resist layer 118a, a second circuit surface resist printing process or letter printing process is carried out by using a solder resist ink, and thereafter, by curing the solder resist ink, a second solder resist layer 118b is formed.

In step S110, as shown in FIG. 21, on the heat-radiating surface side, a heat-radiating surface resist printing process is carried out by using a solder resist ink, and thereafter, by curing the solder resist ink, a solder resist layer 122 is formed.

In step S111 and step S112 of the manufacturing process of the printed circuit board relating to the conventional technique, external shaping and boring processes are carried out, and a surface finishing process is then carried out. The purpose of the surface finishing process is to clean a copper foil surface, and degreasing and rust-removing processes are carried out by using acid.

The above-mentioned printed circuit board and manufacturing method thereof have been described in Japanese Patent Application Laid Open No. 2011-222962 (Patent Document 1) and Japanese Patent Application Laid Open No. H5-267829 (Patent Document 2).

PRIOR-ART DOCUMENTS

Patent Document

Patent Document 1: Japanese Patent Application Laid Open No. 2011-222962

Patent Document 2: Japanese Patent Application Laid Open No. H5-267829

SUMMARY OF THE INVENTION

Problems to be Solved by the Invention

In the printed circuit board 100 relating to the conventional technique, a problem is raised in that heat generated from the part assembling conductor layer 114 of the circuit surface is thermally conducted to the heat-radiating conductor layer 120 of the heat-radiating surface through the base member 112, and then accumulated inside the solder resist layer 122 to cause a poor heat-radiating property.

Moreover, because of this, the thermal expansion of a copper foil serving as the heat-radiating conductor layer 120 is caused, with the result that a problem of warping and twisting is raised on the entire printed circuit board 100.

Furthermore, in the conventional process, the etching resist layer printing process is carried out on the heat-radiating surface, and a solder resist layer printing process on the heat-radiating surface is further carried out after the solder resist layer printing process of the circuit surface.

As a result, due to the necessity of the printing processes of two times on the heat-radiating surface, problems of process costs including the amount of ink use and process time are raised.

The present invention has been devised to solve the above-mentioned conventional problems, and its object is to provide a printed circuit board that improves the heat radiating effect as the entire printed circuit board and a manufacturing method for such a printed circuit board.

Means for Solving the Problem

A printed circuit board in accordance with the present invention includes:

a base member having two main surfaces;

at least one heat-radiating conductor layer that is formed on at least one of the two main surfaces of the base member; and a solder resist layer formed on the surface of the heat-radiating conductor layer, and in this configuration, the printed circuit board is characterized in that the heat-radiating conductor layer has two main surfaces and at least one side face;

the heat-radiating conductor layer has one of the main surfaces of the two main surfaces made in planar contact with the main surface of the base member;

the solder resist layer further has an etching liquid resistant property, and is formed on the other main surface of the two main surfaces of the heat-radiating conductor layer, with the side face of the heat-radiating conductor layer being exposed; and the heat-radiating conductor layer and the solder resist layer form a laminate having a substantially convex shape with an appropriate height.

Moreover, the printed circuit board of the present invention may include, for example, a base member having two main surfaces;

a laminate having a substantially convex shape with an appropriate height that is made of a heat-radiating conductor layer and a solder resist layer formed on either one of the main surfaces of the base member, and in this configuration, the printed circuit board is characterized in that on the main surface of the base member on which the laminate having the substantially convex shape is formed, a part assembling conductor layer and a solder resist layer covering a wiring conductor layer are formed at a position adjacent to the substantially convex shaped laminate.

Furthermore, the printed circuit board in accordance with the present invention is preferably formed as such a printed circuit board characterized in that in addition to the above-mentioned substantially convex shaped laminate, a laminate having the same shape is formed separately from the above-mentioned substantially convex shaped laminate on the same main surface of the base member, with a gap being formed between side faces of the two laminates, and a part assembling conductor layer is provided at a position relative to the gap as the base member serving as a border, and the length of the gap in parallel with the main surface of the base member is shorter than the length of the part assembling conductor layer in parallel with the main surface of the base member.

A manufacturing method of a printed circuit board in accordance with the present invention, which is a manufacturing method of a printed circuit board for manufacturing the printed circuit board in accordance with the present invention, is characterized by including the steps of:

preparing a base substrate having two main surfaces, with a metal layer being formed on at least one of the main surfaces;

forming a solder resist layer on at least one of the main surfaces of the two main surfaces of the base substrate by a pattern printing process including a resist printing process; and forming a laminate having a substantially convex shape with an appropriate height by etching the metal layer on the base substrate.

Effects of Invention

In accordance with the present invention, since the side face of the heat-radiating conductor layer under the solder resist layer is exposed, it is possible to provide a printed circuit board that promotes the heat radiating effect as the entire printed circuit board and improves mechanical characteristics such as warping and twisting of the substrate, and a manufacturing method of such a printed circuit board.

DETAILED DESCRIPTION OF THE INVENTION

Hereinafter, embodiments of the present invention will be described with reference to the accompanying drawing for the sake of understanding of the invention.

(Embodiment 1)

(Configuration of Printed Circuit Board Relating to Embodiment 1)

Figure 1A:
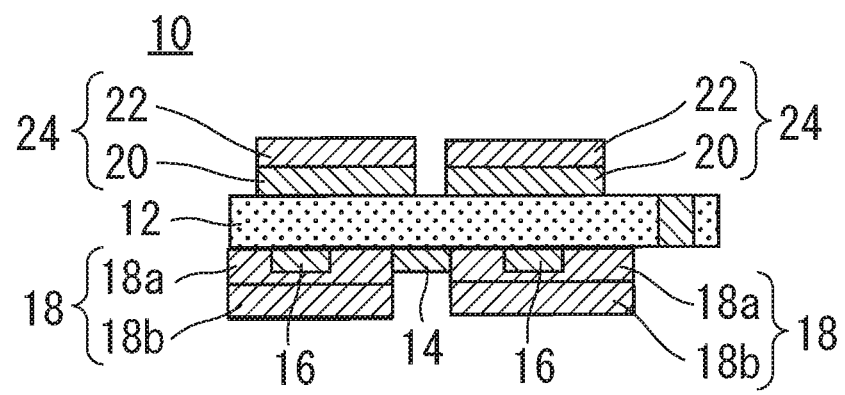
FIG. 1(a) is a cross-sectional view showing a printed circuit board in accordance with embodiment 1.
Figure 1B:
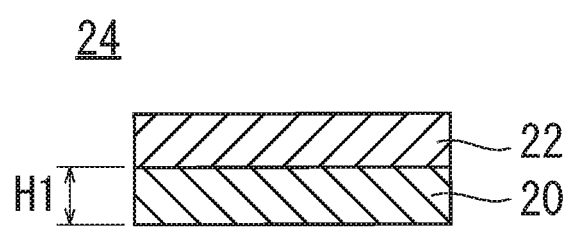
FIG. 1(b) is an enlarged cross-sectional view showing a laminate having a substantially convex shape with a predetermined height, which is formed on the printed circuit board in accordance with embodiment 1.

FIG. 1(a) is a cross-sectional view showing a printed circuit board in accordance with embodiment 1, and FIG. 1(b) is an enlarged cross-sectional view showing a laminate having a substantially convex shape with a predetermined height, which is formed on the printed circuit board in accordance with embodiment 1.

Hereinafter, referring to FIG. 1, the following description will explain a printed circuit board 10 in accordance with embodiment 1.

A printed circuit board 10 in accordance with embodiment 1 includes a base member 12. On the circuit surface of the base member 12, a large number of part assembling conductor layers 14, wiring conductor layers 16 and circuit surface resist layers 18 are formed. On a heat-radiating surface of the base member 12, a large number of laminates 24, each constituted by a heat-radiating conductor layer 20 and a solder resist layer 22 and formed into a substantially convex shape having an appropriate height, are formed.

The base member 12 is formed by, for example, a base substrate 30.

The base substrate 30, which has a thickness of 0.1 to 1.0 mm and is made by bonding metal layers 32 such as copper foils or the like onto the base member 12 made of an insulating resin, is provided with the base member 12, the part assembling conductor layer 14, the wiring conductor layer 16 and the heat-radiating conductor layers 20 formed thereon, by etching copper foils.

In embodiment 1, glass cloth epoxy resin laminated sheets, which include: CS-3945 (double layer) made by RISHO KOGYO CO., LTD; CS-3940 (single layer) made by RISHO KOGYO CO., LTD; NIKAPLEX L-6504/L-6504C/L-6504C UV/NIKAPLEX L-6504/L-6504C/L-6504C UV made by NIKKAN INDUSTRIES CO., LTD.; MCL-E-67 made by HITACHI CHEMICAL CO., LTD.; R-1705, R-1705SX, R-1705SH, R-1705UX, R-1705UC made by Panasonic Corporation; S1600 made by Shengyi Technology Co., Ltd.; UV BLOCK FR-4-86 made by NANYA Technology Corporation; ELC-4768 made by Sumitomo Bakelite Co. Ltd., etc., may be used.

Additionally, in embodiment 1, in addition to the glass cloth epoxy resin laminated sheets, paper phenolic substrates, paper epoxy substrates, glass-composite substrates, Teflon (registered trademark) substrates, alumina substrates, polyimide substrates, etc. are sometimes used.

The part assembling conductor layer 14 is formed by etching the metal layer 32 made of a copper foil having a thickness of 18 to 70 μm.

The part assembling conductor layer 14 has two main surfaces and at least one side face, and one of the main surfaces of the two main surfaces is made in planar contact with the main surface of the base member 12, and the side face is further made in planar contact with a side face of a first solder resist layer 18a.

Additionally, the side face of the part assembling conductor layer 14 needs not be made in planar contact with the side face of the first solder resist layer 18a.

The first solder resist layer 18a covers the wiring conductor layer 16. Moreover, the main surface of a second solder resist layer 18b is made in planar contact with one of the main surfaces of the first solder resist layer 18a so that a laminate having a substantially convex shape is formed.

In the case when an electronic part having a high heat generation such as an IC is assembled on the part assembling conductor layer 14, it is necessary to increase a thermal conductivity around the part assembling conductor layer 14 so as to provide a heat-radiating effect.

The heat-radiating conductor layer 20 is formed by etching the metal layer 32 made of a copper foil having a thickness of 18 to 70 μm. The heat-radiating conductor layer 20 has two main surfaces and at least one side face, and one of the main surfaces of the two main surfaces is made in planar contact with the main surface of the base member 12.

In general, the heat-radiating conductor layer 20 is made by using a copper foil that has good electric conductivity and thermal conductivity and is inexpensive; however, it has been known that warping and twisting due to thermal deformation of the low cost substrate that is thin and low in bending rigidity are mainly caused by the thermal expansion of the copper foil.

In accordance with the printed circuit board 10 relating to embodiment 1, on the heat-radiating surface, by exposing the side face of the heat-radiating conductor layer 20 and the solder resist layer 22, a portion corresponding to the thickness of the heat-radiating conductor layer 20, that is, a height corresponding to a length H1 in a vertical direction to the main surface of the heat-radiating conductor layer 20, as shown in FIG. 1(b), is prepared so that a laminate 24 having a substantially convex shape with an appropriate height is formed. As a result, by the exposed side face of the heat-radiating conductor layer 20 and the enlarged surface area of the laminate 24, the heat-radiating effect is promoted on the entire substrate, and by the subsequent reduction of the thermal expansion of the copper foil, the mechanical characteristics relating to warping and twisting of the printed circuit board are improved.

The circuit surface resist layer 18 and the solder resist layer 22 are further provided with "resistance to an etching liquid" and "resistance to an ink removing liquid" in addition to "solder resist performance", and formed by carrying out a resist printing process by using a solder resist ink.

In this case, "resistance to an etching liquid" means a property by which the solder resist layer 22 is prevented from being dissolved by an etching liquid, that is, etching acid resistance, and a property by which the solder resist layer 22 is prevented from being removed by an etching liquid, that is, solder resist removing resistance.

Moreover, "resistance to an ink removing liquid" means a property by which the solder resist layer 22 is prevented from being dissolved by an ink removing liquid, that is, alkali resistance, and a property by which the solder resist layer 22 is prevented from being removed by the ink removing liquid, that is, solder resist removing resistance.

In the printed circuit board 10 of embodiment 1, the circuit surface resist layer 18 is formed on the circuit surface, and the solder resist layer 22 is formed on the heat-radiating surface.

Each of the circuit surface resist layer 18 and the solder resist layer 22 is provided with two main surfaces and at least one side face. On the circuit surface, the first solder resist layer 18*a* is formed so as to cover the wiring conductor layer 16, and one of the main surfaces of the two main surfaces of the first solder resist layer 18*a* is made in planar contact with the main surface of the base member 12, and at least one side face of the first solder resist layer 18*a* is made in planar contact with a side face of the part assembling conductor layer 14. With respect to the second solder resist layer 18*b*, one of the two main surfaces is made in planar contact with the main surface of the first solder resist layer 18*a*, and moreover, the other main surface and side face are exposed. In contrast, on the heat-radiating surface, the solder resist layer 22 is formed on the other main surface of the two main surfaces of the heat-radiating conductor layer 20, and together with the side face of the heat-radiating conductor layer 20, the side face and the other main surface thereof are exposed.

On the heat-radiating surface, by exposing the side face of the heat-radiating conductor layer 20 and the solder resist layer 22, a portion corresponding to the thickness of the heat-radiating conductor layer 20, that is, a height corresponding to a length H1 in a vertical direction to the main surface of the heat-radiating conductor layer 20, is prepared so that a laminate 24 having a substantially convex shape with an appropriate height is formed. As a result, by the exposed side face of the heat-radiating conductor layer 20 and the enlarged surface area of the laminate 24, the heat-radiating effect is promoted on the entire substrate, and by the subsequent reduction of the thermal expansion of, for example, a copper foil serving as the heat-radiating conductor layer, the mechanical characteristics relating to warping and twisting of the printed circuit board are improved.

In the printed circuit board 10 relating to embodiment 1, on the main surface of the base member 12, in addition to the laminate 24 having a substantially convex shape, a laminate having the same shape is formed on the same main surface, in a separate manner from the laminate 24 having a substantially convex shape. Moreover, a gap is formed between the side faces of the two laminates, and the part assembling conductor layer 14 is installed at a position relative to the gap with the base member 12 serving as a border.

Furthermore, the length of the above-mentioned gap in parallel with the main surface of the base member 12 is shorter than the length of the part assembling conductor layer 14 that is in parallel with the main surface of the base member 12.

In this manner, from the viewpoint that the part assembling conductor layer 14 is close to the side face of the heat-radiating conductor layer 20 as well, the heat radiating effect is promoted.

In the printed substrate 10 in accordance with embodiment 1, moreover, through holes penetrating the base member 12 or the base member 12 and the part assembling conductor layer 14 may be formed.

(Method of Manufacturing Printed Circuit Board Relating to Embodiment 1)

Figure 2:
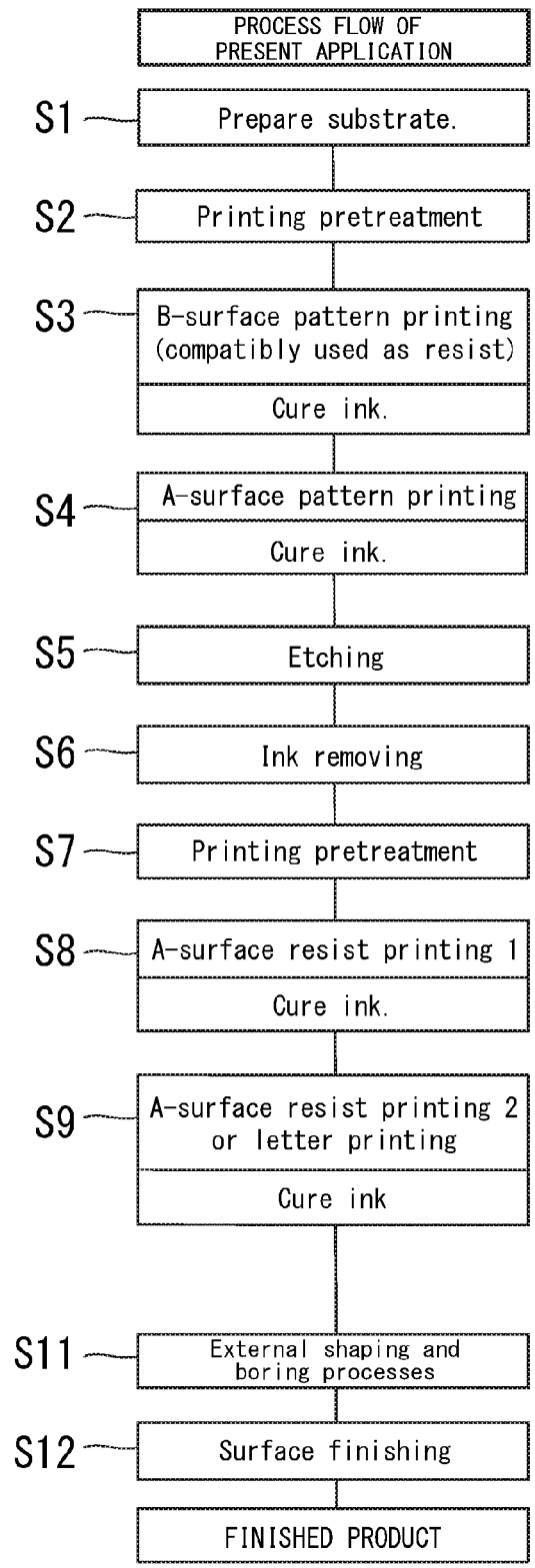
FIG. 2 is a flow chart for explaining manufacturing processes of the printed circuit board in accordance with embodiment 1.

FIG. 2 is a flow chart for explaining manufacturing processes of a printed circuit board shown in FIG. 1. In the flow chart, an A-surface is a circuit surface, and a B-surface is a heat radiating surface.

FIG. 3 to FIG. 9 are process cross-sectional views for use in explaining a manufacturing method of the printed circuit board shown in FIG. 1.

Hereinafter, referring to these views, the manufacturing method of the printed circuit board relating to preferred embodiment 1 of the present invention will be explained.

Figure 3:
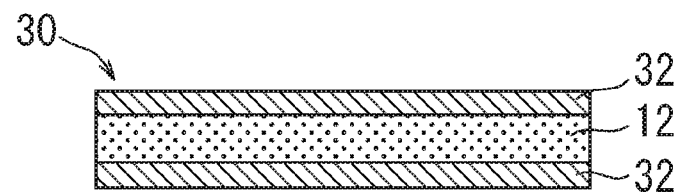
FIG. 3 is a process cross-sectional view for explaining step S1 of the manufacturing processes of the printed circuit board in accordance with embodiment 1.

In the first step S1 shown in FIG. 2, as shown in FIG. 3, a base substrate 30 in which metal layers 32 are formed on two surfaces of a base member 12 is prepared.

The metal layers 32, which are formed into a heat-radiating conductor layer 20, a part assembling conductor layer 14 and a wiring conductor layer 16 through etching processes explained below, are made by using a copper foil that is an inexpensive metal having good electric conductivity and thermal conductivity. After completion of step S1 of the manufacturing processes, a printing pretreatment of step S2 of the manufacturing processes is carried out.

Figure 4:
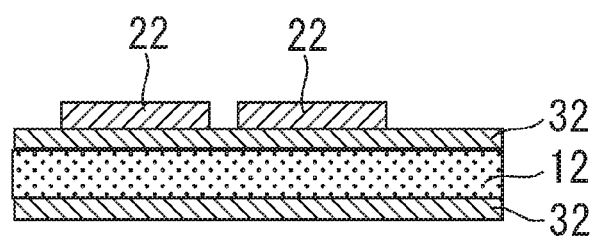
FIG. 4 is a process cross-sectional view for explaining steps S2 and S3 of the manufacturing processes of the printed circuit board in accordance with embodiment 1.

As shown in FIG. 4, by using the aforementioned solder resist ink, a pattern printing process including a resist printing process is carried out on the heat-radiating surface of the base member 12, and thereafter, the solder resist ink is cured so that a solder resist layer 22 is formed.

As the solder resist ink, a ultraviolet-ray curing type ink that has a thickness of 5 to 30 μm and is cured by ultraviolet rays and a thermosetting type ink that is cured by heat (including photograph developing type) are proposed, and an insulating resin is used.

In embodiment 1, since after forming the solder resist layer 22 by using a solder resist ink, an etching liquid is used, the solder resist ink needs to further have "etching liquid resistance" so as to prevent the solder resist layer 22 from being affected by the etching liquid.

In embodiment 1, as the solder resist ink of the ultraviolet-ray curing type, the following materials may be used: PLAS FINE PSR-310 (A-99F), PLAS FINE PSR-310 (SC-84) and PLAS FINE PSR-310 (SW-26) made by GOO CHEMICAL CO., LTD; SSR-1600 WS10 and SSR-1600WS11 made by SAN-EI KAGAKU CO., LTD; USR-2B14-84-200 and USR-2G14-94-250 made by TAMURA KAKEN CORPORATION, etc. Moreover, as the solder resist ink of the thermosetting type, LE-6000S made by SAN-EI KAGAKU CO., LTD., and PSR-4000 G24K, PSR-4000 LEW3 and S-40 T1 made by TAIYO INK MFG. CO., LTD., etc. may be used.

Figure 5:
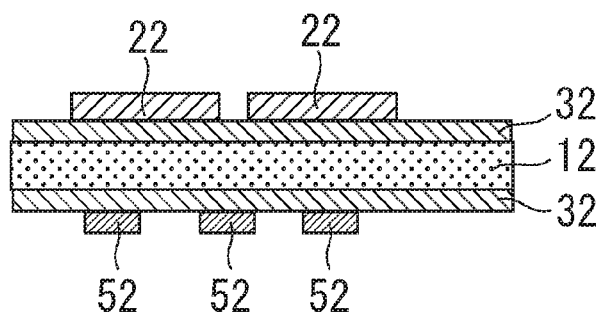
FIG. 5 is a process cross-sectional view for explaining step S4 of the manufacturing processes of the printed circuit board in accordance with embodiment 1.

In step S4, as shown in FIG. 5, a pattern printing process is carried out on the circuit surface of the base member 12 by using an etching resist ink, and the etching resist ink is then cured so that an etching resist layer 52 is formed.

As the etching resist ink, an ink that has a thickness of 5 to 30 μm and can be removed by an alkaline solution is used.

In embodiment 1, as the etching resist ink, PLAS FINE PER-51B made by GOO KEMICAL CO., LTD., and PLAS FINE PER-213B-5, PER-57BH or the like made by the same company may be used.

Figure 6:
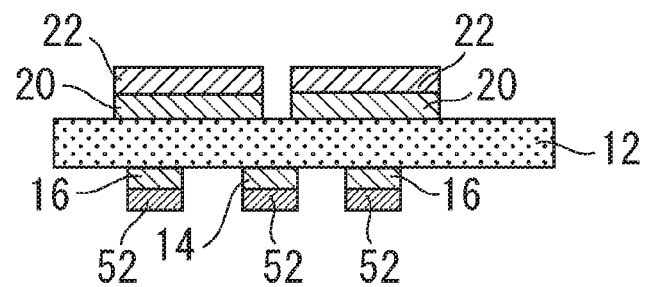
FIG. 6 is a process cross-sectional view for explaining step S5 of the manufacturing processes of the printed circuit board in accordance with embodiment 1.

In step S5, as shown in FIG. 6, the heat-radiating conductor layer 20 to be used as the base of the solder resist layer 22 is formed by an etching process.

As the etching liquid, ferric chloride or cupric chloride is used. The ferric chloride is used under conditions of a concentration of 42% or less and a use temperature in a range from 15° C. to 55° C., normally about 40° C., and the cupric chloride is used under conditions of a concentration of 40% or less and a use temperature in a range from 15° C. to 55° C., normally about 40° C.

In embodiment 1, as a main agent for the etching liquid, a ferric chloride solution made by RASA INDUSTRIES, LTD., or copper chloride (II) dehydrate made by YONEYAMA KOGYO CO., LTD may be used, and hydrochloric acid, hydrogen peroxide or the like may be sometimes used as an assisting agent for the etching liquid.

Figure 7:
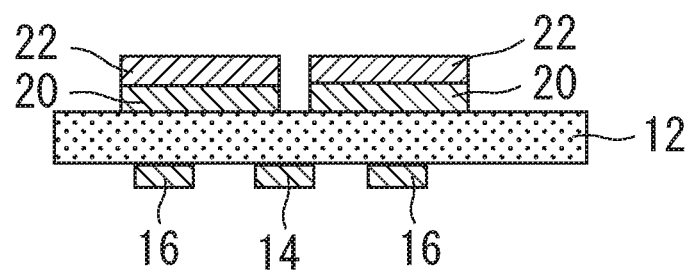
FIG. 7 is a process cross-sectional view for explaining step S6 of the manufacturing processes of the printed circuit board in accordance with embodiment 1.

In step S6, as shown in FIG. 7, the etching resist layer 52 is removed by removing the ink.

In embodiment 1, as the ink removing solution, in addition to a sodium hydroxide aqueous solution made by KANEKA CORPORATION, a sodium carbonate aqueous solution or the like is sometimes used.

The sodium hydroxide is used under conditions of a concentration of 10% or less and a use temperature in a range from 15° C. to 50° C., normally about 30° C., and the sodium carbonate is used under conditions of a concentration of 5% or less and a use temperature in a range from 15° C. to 50° C., normally about 30° C.

Additionally, in embodiment 1, since after forming the solder resist layer 22 by using a solder resist ink, an ink removing solution is used, the solder resist ink needs to further have "ink removing solution resistance" so as to prevent the solder resist layer 22 from being affected by the ink removing solution.

Figure 8:
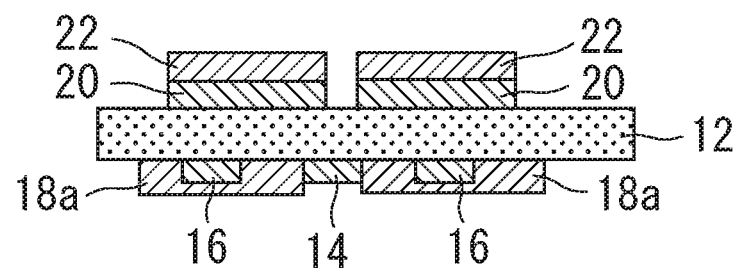
FIG. 8 is a process cross-sectional view for explaining steps S7 and S8 of the manufacturing processes of the printed circuit board in accordance with embodiment 1.

In steps S7 and S8, as shown in FIG. 8, after the printing pretreatment, a pattern printing process is carried out on the circuit surface of the base member 12 by using a solder resist ink, and the solder resist ink is then cured so that a first solder resist layer 18a is formed.

Figure 9:
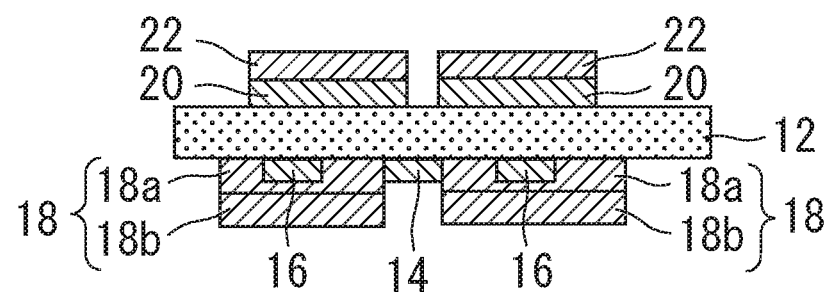
FIG. 9 is a process cross-sectional view for explaining step S9 of the manufacturing processes of the printed circuit board in accordance with embodiment 1.

In step S9, as shown in FIG. 9, on the first solder resist layer 18a formed on the circuit surface of the base member 12, a pattern printing process is further carried out by using a solder resist ink so that a second solder resist layer 18b is formed, and the solder resist ink is then cured; thus, a laminate made of solder resist layers is formed.

In step S11 and step S12 of the manufacturing processes of the printed circuit board relating to embodiment 1, external shaping and boring processes are carried out, and a surface finishing process is then carried out. The purpose of the surface finishing process is to clean a copper foil surface, and degreasing and rust-removing processes are carried out by using acid.

In embodiment 1, as the chemical polishing agent, Mec Bright CB-5612 made by MEC. CO., LTD. and Teck CL-8 made by ADEKA Corporation are used, and as the rust preventive agent, Tough Ace F2 made by SHIKOKU CHEMICALS CORPORATION, Mec Seal CL-5018 or the like made by MEC. CO., LTD. may be used.

In the printed circuit board 10 in accordance with embodiment 1, heat generated from the part assembling conductor layer 14 of the circuit surface is thermally conducted to gaps generated between the side faces of the laminate 24 having the substantially convex shape on the heat-radiating surface and the heat-radiating conductor layer 20, through the base member 12. Thereafter, heat that has reached the gap, as it is, is discharged outside, while heat that has reached the heat-radiating conductor layer 20 is discharged outside through the side face that is exposed.

Therefore, since the printed circuit board relating to embodiment 1 can discharge heat from both of the gap generated between the side faces of the laminate having a substantially convex shape and the heat-radiating conductor layer 20, the heat-radiating effect is further enhanced, and by the subsequent reduction of the thermal expansion of the copper foil, the mechanical characteristics relating to warping and twisting of the printed circuit board are improved.

A manufacturing method of a printed circuit board in accordance with embodiment 1 reviews the manufacturing processes of printed circuit boards of the conventional processes, and carries out printing processes of two times on the heat-radiating surface collectively as a pattern printing process including a resist printing process, prior to etching. As a result, the number of the printing processes on the heat-radiating surface can be reduced by one time, thereby making it possible to reduce process costs including the amount of use of ink and the process time.

(Embodiment 2)
(Configuration of Printed Circuit Board Relating to Embodiment 2)

Figure 11:
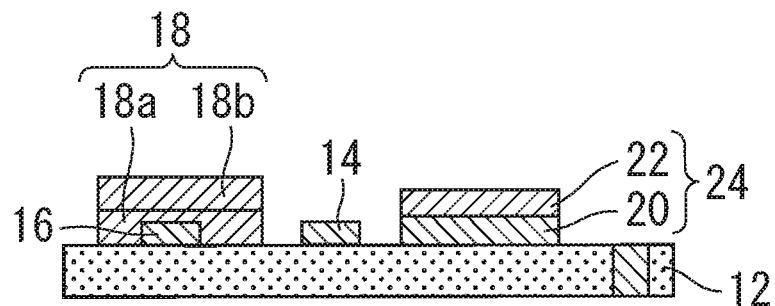
FIG. 11 is a cross-sectional view showing a printed circuit board in accordance with embodiment 2.

FIG. 11 is a cross-sectional view showing a printed circuit board in accordance with embodiment 2.

The printed circuit board 10 in accordance with embodiment 1 has a configuration in which on the circuit surface of the base member 12, a large number of part assembling conductor layers 14, wiring conductor layers 16 and circuit surface resist layers 18 are formed, and on the heat-radiating surface of the base member 12, a large number of laminates 24, each constituted by a heat-radiating conductor layer 20 and a solder resist layer 22 and formed into a substantially convex shape having an appropriate height, are formed.

In comparison with the printed circuit board of embodiment 1, a printed circuit board 10' in accordance with embodiment 2 has a configuration in which a large number of laminates 24, each constituted by a heat-radiating conductor layer 20 and a solder resist layer 22 and formed into a substantially convex shape having an appropriate height, are formed in the same manner as in the configuration of embodiment 1 and a large number of part assembling conductor layers 14, wiring conductor layers 16 and solder resist layers 18, which are the same as those of embodiment 1, are formed on the same main surface of each of the base members 12.

(Method of Manufacturing Printed Circuit Board Relating to Embodiment 2)

As manufacturing processes of the printed circuit board 10' in accordance with embodiment 2, the following processes are carried out.

A base substrate 30 in which metal layers 32 are formed on one of the two surfaces of a base member 12 is prepared. The metal layers 32, which are formed into a heat-radiating conductor layer 20, a part assembling conductor layer 14 and a wiring conductor layer 16 through etching processes explained below, are made by using a copper foil that has good electric conductivity and is inexpensive metal.

After a printing pretreatment, a solder resist printing process is carried out on either one of the surfaces of the base substrate 30, and thereafter, by carrying out an etching resist printing process thereon, a solder resist layer 22 and an etching resist layer 52 are formed.

Additionally, in the manufacturing processes of embodiment 2 also, since after formation of the solder resist layer 22 by using a solder resist ink, an etching liquid is used, the solder resist ink needs to further have "etching liquid resistance" so as to prevent the solder resist layer 22 from being affected by the etching liquid.

By removing copper foils that are unnecessary metal layers by using etching, a laminate 24 having a substantially convex shape with an appropriate height, made by the heat-radiating conductor layer 20 and the solder resist layer 22, is formed, and a laminate having a substantially convex shape with an appropriate height, made by the part assembling conductor layer 14 and the etching resist layer 52, is formed so as to be adjacent thereto, and so as to be adjacent thereto, a laminate having a substantially convex shape with an appropriate height, made by the wiring conductor layer 16 and the etching resist layer 52, is also formed.

By removing the etching resist layer 52 by using an ink removing process, the laminate having a substantially convex shape with an appropriate height, made by the part assembling conductor layer 14 and the etching resist layer 52, is formed into a single layer shape corresponding to the part assembling conductor layer 14, while the laminate having a substantially convex shape with an appropriate height, made by the wiring conductor layer 16 and the etching resist layer 52, is formed into a single layer shape corresponding to the wiring conductor layer 16.

Additionally, in the manufacturing processes of embodiment 2 also, since after formation of the solder resist layer 22 by using a solder resist ink, an ink removing solution is used; therefore, the solder resist ink needs to further have "ink removing solution resistance" so as to prevent the solder resist layer 22 from being affected by the ink removing solution.

A resist printing process is carried out on the wiring electrode layer 16 so that a solder resist layer 18 is formed so as to cover the wiring conductor layer 16.

In the manufacturing processes of the printed circuit board 10' relating to embodiment 2, external shaping and boring processes are carried out, and a surface finishing process is then carried out. The purpose of the surface finishing process is to clean a copper foil surface, and degreasing and rust-removing processes are carried out by using acid.

In the printed circuit board 10' relating to embodiment 2, since the circuit surface and the heat-radiating surface are formed on the same surface, the heat-radiating effect is promoted on the entire substrate in the same manner as in the printed circuit board 10 relating to embodiment 1, and by the subsequent reduction of the thermal expansion of the copper foil, the mechanical characteristics relating to warping and twisting of the printed circuit board are improved.

In the manufacturing method of the printed circuit board relating to embodiment 2 also, printing processes of two times, which have been carried out on the heat-radiating surface in the conventional process, are collectively carried out as a pattern printing process including a resist printing process, prior to etching so that the number of the printing processes on the heat-radiating surface can be reduced by one time, thereby making it possible to reduce process costs including the amount of use of ink and the process time.

EXAMPLES

First, by using the same method as the manufacturing method of the printed circuit board relating to the above-mentioned embodiment 1, a printed circuit board 10 in accordance with embodiment 1 shown in FIG. 1 was manufactured.

Additionally, in the process for forming the printed circuit board 10 in accordance with embodiment 1, as "substrate", CS-3945 (double layer) (copper foil thickness: 0.035 mm+0.035 mm, thickness of base member: 0.1 mm) made by RISHO KOGYO CO., LTD. serving as a glass cloth epoxy resin laminated plate, was used, as "ultraviolet-ray curing type solder resist ink", PLAS FINE PSR-310 (A-99F) (thickness: 0.022 mm on copper foil) made by GOO CHEMICAL CO., LTD was used, as "etching resist ink", PLAS FINE PER-51B made by GOO CHEMICAL CO., LTD was used, as "main agent for etching liquid", a ferric chloride solution made by RASA INDUSTRIES, LTD was used, as "assisting agent for etching liquid", hydrochloric acid was used, as "chemical polishing agent", Mec Bright DB-5612 made by MEC. CO., LTD. was used, and as "rust preventive agent", Tough Ace F2 made by SHIKOKU CHEMICALS CORPORATION was used respectively.

Figure 10A:
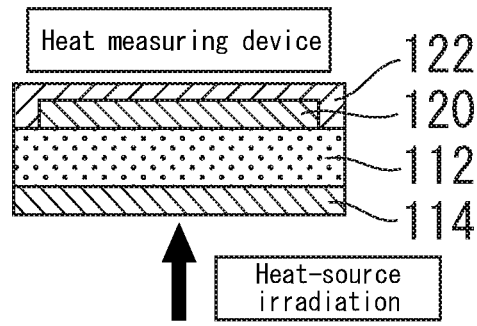
FIG. 10(a) is a partial cross-sectional view for explaining a process for measuring heat generated by heat-source irradiation onto a circuit surface on "a printed circuit board relating to a conventional technique" on a heat radiating surface.
Figure 10B:
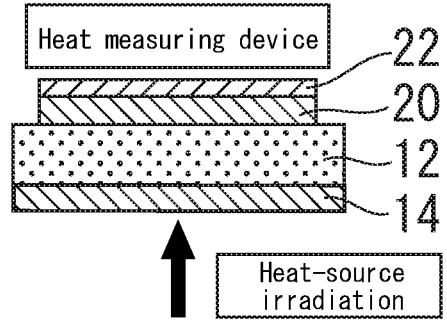
FIG. 10(b) is a partial cross-sectional view for explaining a process for measuring heat generated by heat-source irradiation onto a circuit surface on "a printed circuit board relating to embodiment 1".

Next, for use as "sample of example" for the following heat-radiating effect confirmation test, one portion of the printed circuit board 10 relating to embodiment 1 shown in FIG. 1 was prepared as "sample B-0 of printed circuit board relating to the present invention" shown in FIG. 10(b).

In "sample B-0 of printed circuit board relating to embodiments" shown in FIG. 10(b), a part assembling electrode layer 14 is formed so as to be made in planar contact with the circuit surface of the base member 12, and a heat-radiating conductor layer 20 is formed so as to be made in planar contact with most of the portions of the heat-radiating surface of the base member 12.

Moreover, a solder resist layer 22 is formed so as to be made in planar contact with the upper surface of the heat-radiating conductor layer 20 on the heat-radiating surface.

Lastly, a heat measuring device is disposed along the upper surface of the solder resist layer 22 on the heat-radiating surface.

Additionally, as "the heat measuring device", a laser flash thermophysical property measuring instrument (model: LFA457 MicroFlash) made by NETZSCH Japan K.K. was used, and a state in which a generated thermal source is transmitted through the heat-radiating surface was measured.

(Comparative Example)

Figure 12:
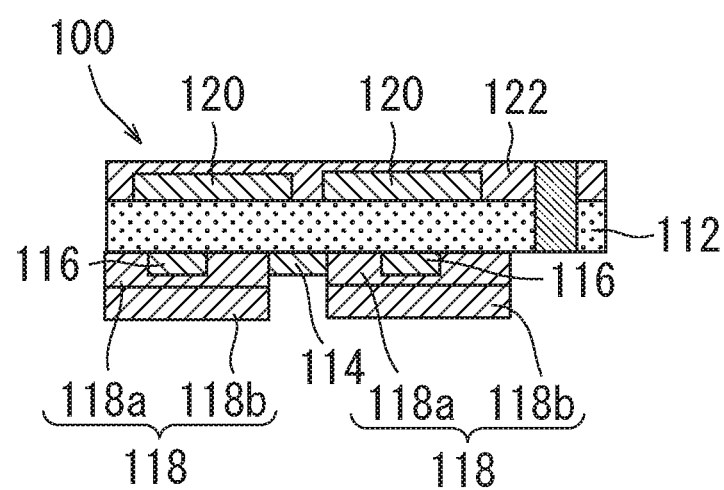
FIG. 12 is a cross-sectional view showing a printed circuit board in accordance with a conventional technique.
Figure 13:
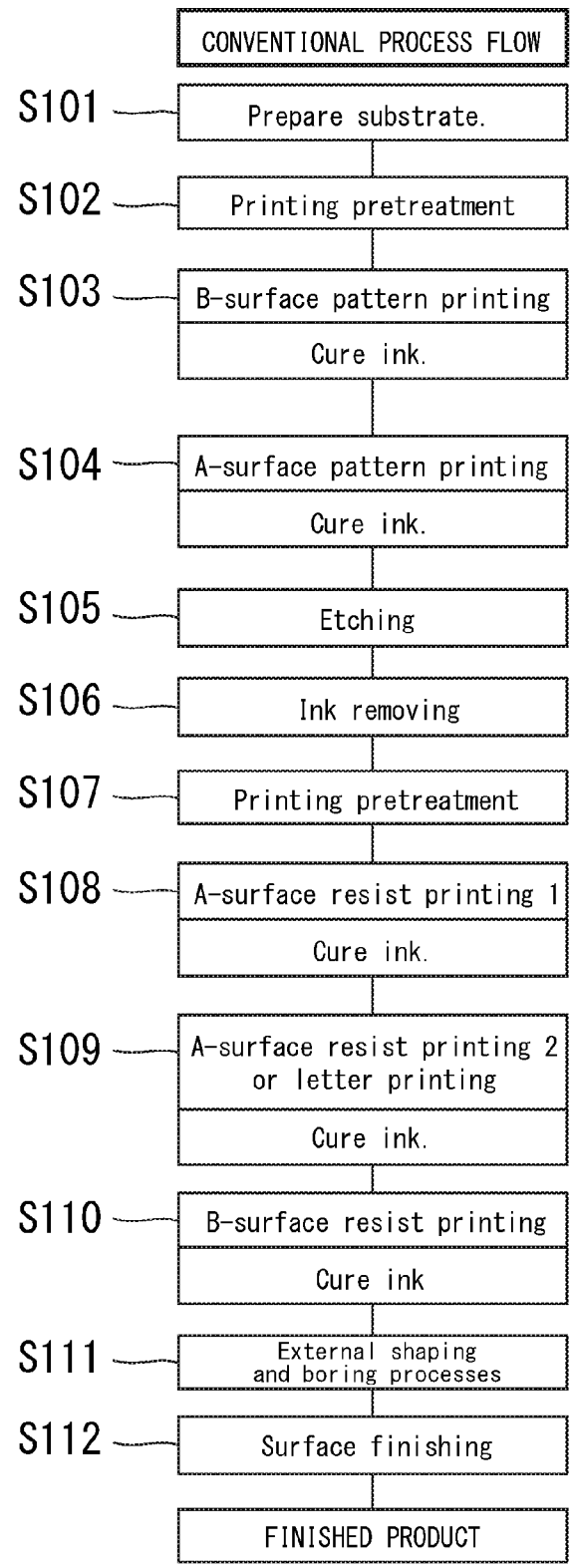
FIG. 13 is a flow chart for explaining manufacturing processes of the printed circuit board in accordance with the conventional technique.
Figure 14:
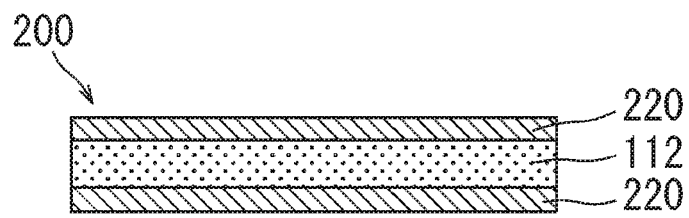
FIG. 14 is a process cross-sectional view for explaining step S101 of the manufacturing processes of the printed circuit board in accordance with the conventional technique.
Figure 15:
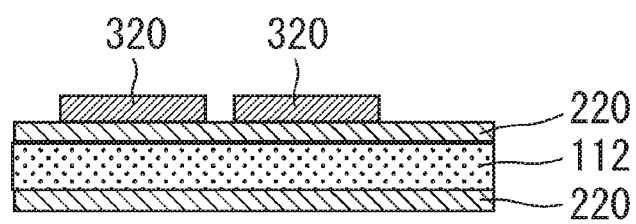
FIG. 15 is a process cross-sectional view for explaining steps S102 and S103 of the manufacturing processes of the printed circuit board in accordance with the conventional technique.
Figure 16:
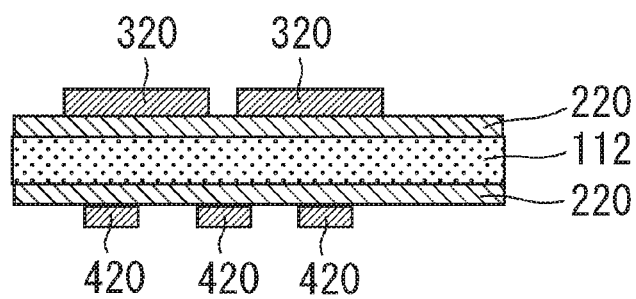
FIG. 16 is a process cross-sectional view for explaining step S104 of the manufacturing processes of the printed circuit board in accordance with the conventional technique.
Figure 17:
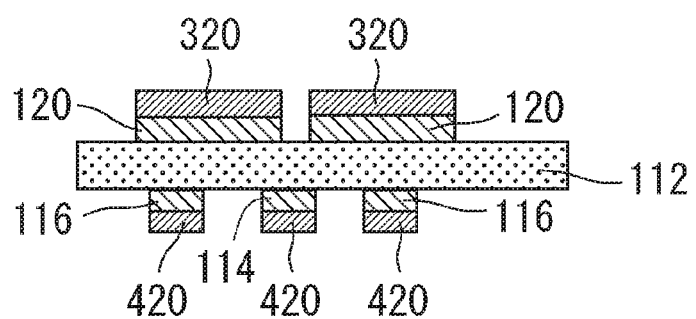
FIG. 17 is a process cross-sectional view for explaining step S105 of the manufacturing processes of the printed circuit board in accordance with the conventional technique.
Figure 18:
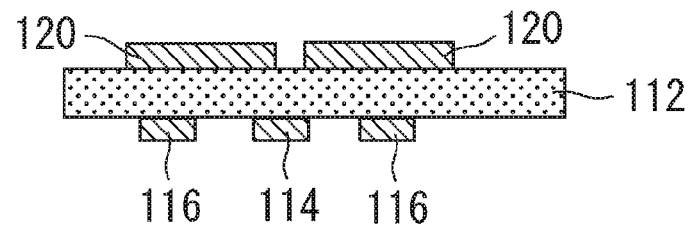
FIG. 18 is a process cross-sectional view for explaining step S106 of the manufacturing processes of the printed circuit board in accordance with the conventional technique.
Figure 19:
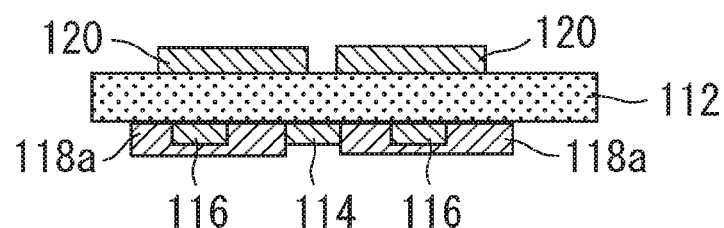
FIG. 19 is a process cross-sectional view for explaining steps S107 and S108 the manufacturing processes of the printed circuit board in accordance with the conventional technique.
Figure 20:
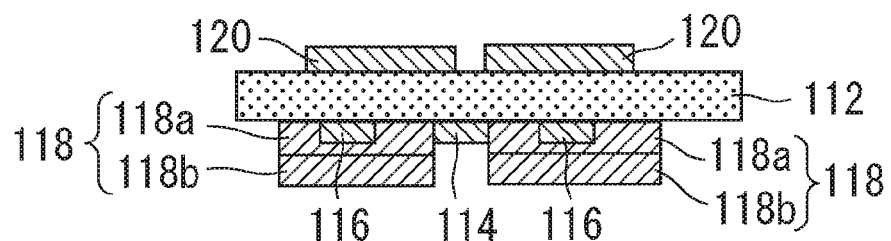
FIG. 20 is a process cross-sectional view for explaining step S109 of the manufacturing processes of the printed circuit board in accordance with the conventional technique.
Figure 21:
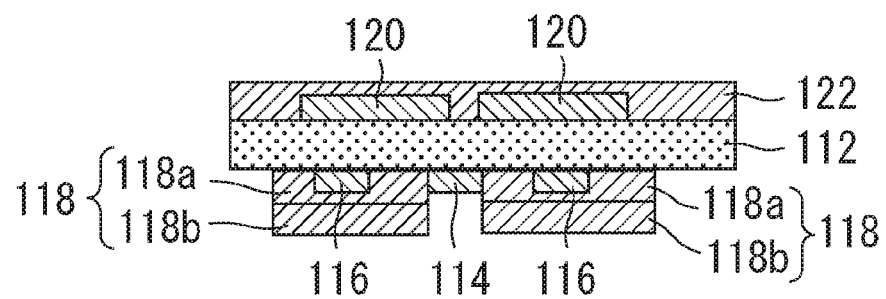
FIG. 21 is a process cross-sectional view for explaining step S110 of the manufacturing processes of the printed circuit board in accordance with the conventional technique.

First, by using the same method as the manufacturing method of the printed circuit board relating to the aforementioned conventional technique, a printed circuit board 100 relating to the conventional technique shown in FIG. 12 was manufactured.

Additionally, the kinds of materials used for manufacturing the printed circuit board 100 relating to the conventional technique were the same as those used for the examples.

Next, for use as "sample of comparative example" for the following heat-radiating effect confirmation test, one portion of the printed circuit board 100 relating to the conventional technique shown in FIG. 12 was prepared as "sample A-0 of printed circuit board relating to the conventional technique" shown in FIG. 10(a).

In "sample A-0 of printed circuit board relating to comparative example" shown in FIG. 10(a), a part assembling electrode layer 114 is formed so as to be made in planar contact with the circuit surface of the base member 112, and a heat-radiating conductor layer 120 is formed so as to be made in planar contact with most of the portions of the heat-radiating surface of the base member 112.

Moreover, a solder resist layer 122 is formed so as to cover the heat-radiating conductor layer 120 on the heat-radiating surface.

Lastly, a heat measuring device is disposed along the upper surface of the solder resist layer 122 on the heat-radiating surface.

Additionally, as "the heat measuring device", a laser flash thermophysical property measuring instrument (model: LFA457 MicroFlash) made by NETZSCH Japan K.K. was used, and a state in which a generated thermal source is transmitted through the heat-radiating surface was measured.

(Concerning Heat-Radiating Effect Confirmation Test)

A confirmation test was carried out as to the fact that the printed circuit board 10 in accordance with the example is improved in heat-radiating property in comparison with the printed circuit board 100 relating to the comparative example.

FIG. 10(a) is a partial cross-sectional view for explaining a process for measuring heat generated by heat-source irradiation onto the circuit surface on "a printed circuit board relating to the comparative example" on the heat radiating surface, and FIG. 10(b) is a partial cross-sectional view for explaining a process for measuring heat generated by heat-source irradiation onto the circuit surface on "a printed circuit board relating to example" on the heat radiating surface.

The measured results are shown in Table 1.

TABLE 1

| Sample | Resist | Thickness (mm) | Thermal diffusivity (mm²/s) | Specific heat (J/(gK)) |
|---|---|---|---|---|
| A-0 | Entire surface | 0.192 | 0.470 | 0.855 |
| B-0 | Partial surface | 0.195 | 0.529 | 0.815 |

In Table 1, "Thermal diffusivity (mm²/s)" means speed at which heat is transferred for one second. Since as this value becomes higher, the time in which heat irradiated by a heat source is transferred to the heat measuring device becomes shorter, it is said that heat radiation becomes better.

As the results of measurements, the heat diffusivity of "sample A-0 of printed circuit board relating to comparative example" was 0.470 mm²/s, and the heat diffusivity of "sample B-0 of printed circuit board relating to example" was 0.529 mm²/s.

Upon consideration that the difference in thickness (mm) between sample A-0 and sample B-0 is only 0.003, while the difference in "thermal diffusivity (mm²/s)" is 0.059, heat radiation of "printed circuit board relating to example" is clearly improved.

This may be attributed to the following factors.

First, in "sample A-0 of printed circuit board relating to comparative example" shown in FIG. 10(a), heat that has been heat-source irradiated toward the part assembling electrode layer 114 on the circuit surface is transferred from the part assembling electrode layer 114 to the heat-radiating conductor layer 120 through the base member 112.

However, since the heat-radiating conductor layer 120 is covered with the solder resist layer 122 on the heat-radiating surface, most of the heat heat-source irradiated is accumulated inside the solder resist layer 122 covering the heat-radiating conductor layer 120.

Therefore, in the case of "sample A-0 of printed circuit board relating to comparative example" shown in FIG. 10(a), since the time (S) in which heat irradiated by a heat source is transferred to the heat measuring device becomes slower than that in "sample B-0 of printed circuit board relating to example" to cause the heat diffusivity (mm²/s) to become lower, it is said that heat radiation thereof is poor.

In contrast, in the case of "sample B-0 of printed circuit board relating to example" of FIG. 10(b), heat heat-source irradiated toward the part assembling conductor layer 14 on the circuit surface is transferred from the part assembling conductor layer 14 to the heat-radiating conductor layer 20 through the base member 12.

Further, since, on the heat-radiating surface, the solder resist layer 22 is formed so as to be made in planar contact with the upper surface of the heat-radiating conductor layer 20, with the side face of the heat-radiating conductor layer 20 being exposed, the above-mentioned heat irradiated by the heat source is also externally discharged from the exposed side face of the heat-radiating conductor layer 20.

Therefore, in the case of "sample B-0 of printed circuit board relating to example" shown in FIG. 10(b), since the time (S) in which heat irradiated by the heat source is transferred to the heat measuring device becomes faster than that in "sample A-0 of printed circuit board relating to comparative example" to cause the heat diffusivity (mm²/s) to become higher, it is said that heat radiation thereof is good.

Based upon the results of the above-mentioned confirmation test of heat-radiating effect, it is said that the printed circuit board 10 relating to the example has improved heat radiation in comparison with the printed circuit board 100 relating to the comparative example.

It is to be understood that while the present invention has been explained in detail by specific "embodiments and examples", these "embodiments and examples" are exemplary only for specifically explaining the present invention. The printed circuit board and its manufacturing method relating to the present invention are not intended to be limited by these "embodiments and examples", and others who are skilled in the applicable arts will recognize various modifications and adaptations which will remain within the technical ideas of the present invention.

Any of simple changes and modifications of the present invention fall within the scope of the present invention, and the specific scope of protection of the present invention will be clearly determined by the scope of claims.

INDUSTRIAL APPLICABILITY

By reviewing manufacturing processes of a printed circuit board, the present invention makes it possible to promote the heat radiating effect of the printed circuit board as a whole and also to provide a printed circuit board in which mechanical characteristics relating to warping and twisting are improved, and a manufacturing method of such a printed circuit board.

REFERENCE SIGNS LIST 10, 10', 100 printed circuit board
12, 112 base member
14, 114 part assembling conductor layer
16, 116 wiring conductor layer
18, 118 circuit surface resist layer
18a, 118a first solder resist layer
18b, 118b second solder resist layer
20, 120 heat-radiating conductor layer
22, 122 solder resist layer
substantially convex-shaped laminate
30, 200 base substrate
32, 220 metal layer (copper foil)
52, 320, 420 etching resist layer

The invention claimed is:
1. A printed circuit board comprising:
a base member having two main surfaces;
at least one heat-radiating conductor layer that is formed on at least one main surface of the two main surfaces of the base member; and
a solder resist layer formed on a surface of the heat-radiating conductor layer, wherein the heat-radiating conductor layer comprises two main surfaces and at least one side face;

one of the main surfaces of the heat-radiating conductor layer being in planar contact with one of the main surfaces of the base member;

the solder resist layer further has an etching liquid resistant property, and is formed on an other one of the main surfaces of the heat-radiating conductor layer, with the side face of the heat-radiating conductor layer being exposed; and the heat-radiating conductor layer and the solder resist layer form a laminate having a convex shape with an appropriate height.

2. The printed circuit board according to claim 1, further comprising:

a wiring conductor layer; and a part assembling conductor layer and an other solder resist layer covering the wiring conductor layer formed on the one of the main surfaces of the base member on which the laminate having the convex shape is formed, and being disposed at a position adjacent to the convex shaped laminate.

3. The printed circuit board according to claim 1, wherein in addition to the convex shaped laminate, a laminate having the same shape is formed separately from the convex shaped laminate on the same main surface of the base member, with a gap being formed between side faces of the two laminates, and further comprising, a part assembling conductor layer provided at a position relative to the gap with the base member serving as a border, and a length of the gap in parallel with the main surface of the base member being shorter than a length of the part assembling conductor layer in parallel with the main surface of the base member.

4. A method for manufacturing the printed circuit board according to claim 1, comprising the steps of:

preparing a base substrate having two main surfaces with a metal layer being formed on at least one of the main surfaces;

forming a solder resist layer on at least one of the main surfaces of the two main surfaces of the base substrate by a pattern printing process including a resist printing process; and forming a laminate having a convex shape with an appropriate height by etching the metal layer on the base substrate.

* * * * *